(12) United States Patent
Kang et al.

(10) Patent No.: US 12,308,352 B2
(45) Date of Patent: May 20, 2025

(54) DISPLAY DEVICE USING MICRO LED

(71) Applicant: LG ELECTRONICS INC., Seoul (KR)

(72) Inventors: Byungjun Kang, Seoul (KR); Junghoon Kim, Seoul (KR); Byoungkwon Cho, Seoul (KR); Mihee Heo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 415 days.

(21) Appl. No.: 17/779,907

(22) PCT Filed: Feb. 10, 2020

(86) PCT No.: PCT/KR2020/001814
§ 371 (c)(1),
(2) Date: May 25, 2022

(87) PCT Pub. No.: WO2021/107271
PCT Pub. Date: Jun. 3, 2021

(65) Prior Publication Data
US 2023/0005886 A1    Jan. 5, 2023

(30) Foreign Application Priority Data
Nov. 25, 2019    (KR) .................... 10-2019-0152574

(51) Int. Cl.
*H01L 25/075*    (2006.01)
*H01L 33/62*    (2010.01)
(Continued)

(52) U.S. Cl.
CPC ......... *H01L 25/0753* (2013.01); *H10H 20/01* (2025.01); *H10H 20/857* (2025.01); *H01L 2224/95085* (2013.01)

(58) Field of Classification Search
CPC ................................................. H01L 25/0753
See application file for complete search history.

(56) References Cited

U.S. PATENT DOCUMENTS

2007/0252289 A1    11/2007    Brewer
2010/0096640 A1    4/2010    Kim et al.
(Continued)

FOREIGN PATENT DOCUMENTS

JP    2007-88100 A    4/2007
KR    10-2018-0082003 A    7/2018
(Continued)

*Primary Examiner* — Zandra V Smith
*Assistant Examiner* — Molly K Reida
(74) *Attorney, Agent, or Firm* — Birch, Stewart, Kolasch & Birch, LLP

(57) ABSTRACT

Discussed is a display device including a base part; a plurality of assembly electrodes disposed on the base part and having a first electrode and a second electrode that generate an electric field when power is applied; a dielectric layer disposed to cover the plurality of assembly electrodes; and a plurality of semiconductor light emitting devices disposed on a surface of the dielectric layer, wherein one surface of the plurality of semiconductor light emitting devices facing the dielectric layer and one surface of the dielectric layer facing the plurality of semiconductor light emitting devices respectively comprise a concave-convex structure.

19 Claims, 16 Drawing Sheets

(51) Int. Cl.
    *H10H 20/01*     (2025.01)
    *H10H 20/857*     (2025.01)

(56) References Cited

U.S. PATENT DOCUMENTS

| | | |
|---|---|---|
| 2011/0198659 A1 | 8/2011 | Han et al. |
| 2013/0214302 A1 | 8/2013 | Yeh et al. |
| 2014/0145227 A1 | 5/2014 | Hoppel et al. |
| 2019/0325790 A1 | 10/2019 | Park et al. |
| 2019/0326477 A1* | 10/2019 | Kim .................. H01L 33/20 |
| 2020/0091370 A1 | 3/2020 | Ting et al. |
| 2022/0352446 A1 | 11/2022 | Chung et al. |

FOREIGN PATENT DOCUMENTS

| | | |
|---|---|---|
| KR | 10-2019-0106885 A | 9/2019 |
| KR | 10-2019-0122117 A | 10/2019 |
| TW | I668737 B | 8/2019 |

* cited by examiner

[FIG. 1]
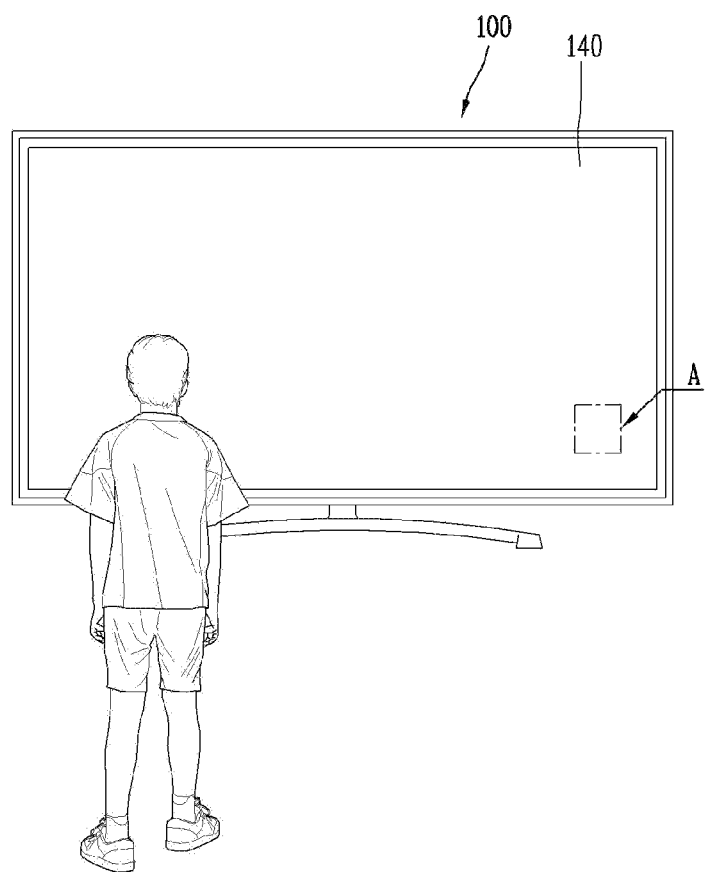

[FIG. 2]
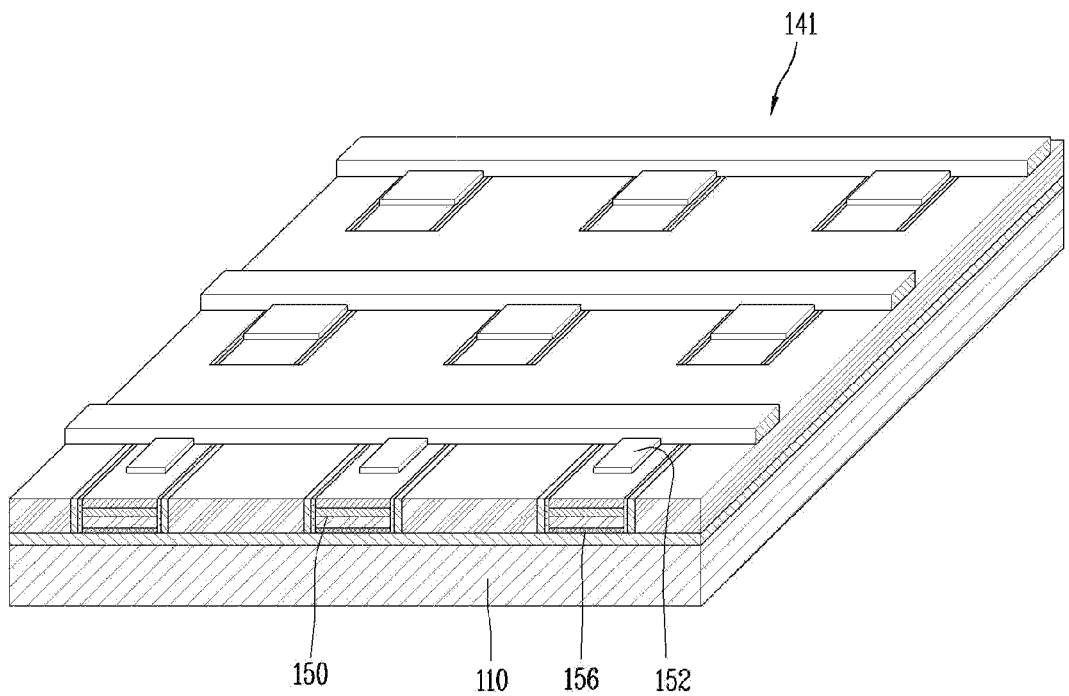
[FIG. 3]
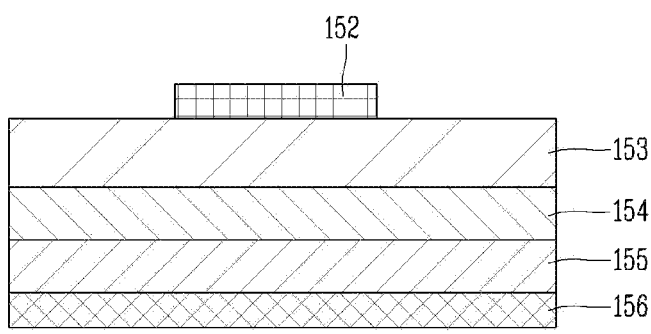

[FIG. 4]
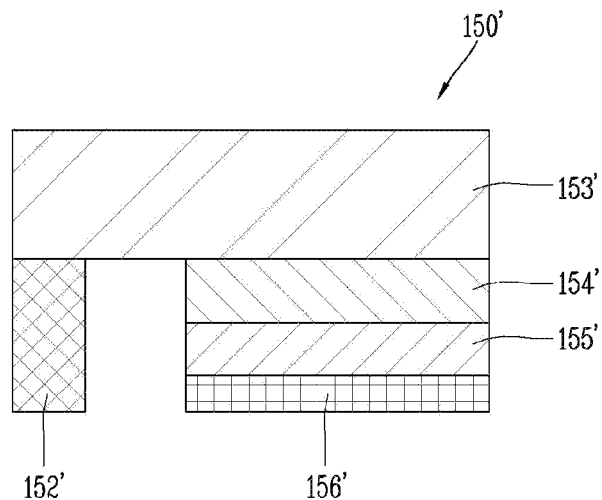
[FIG. 5a]
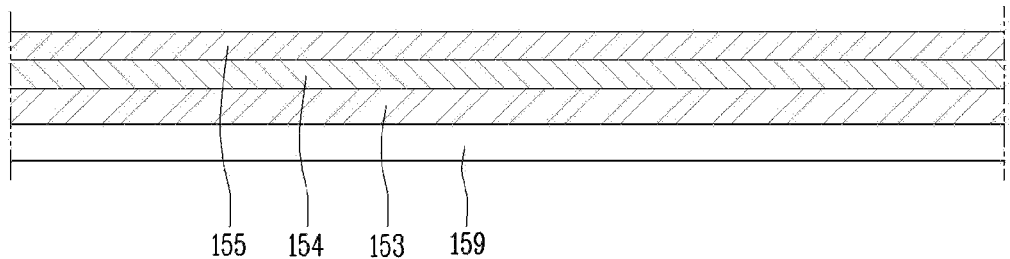
[FIG. 5b]
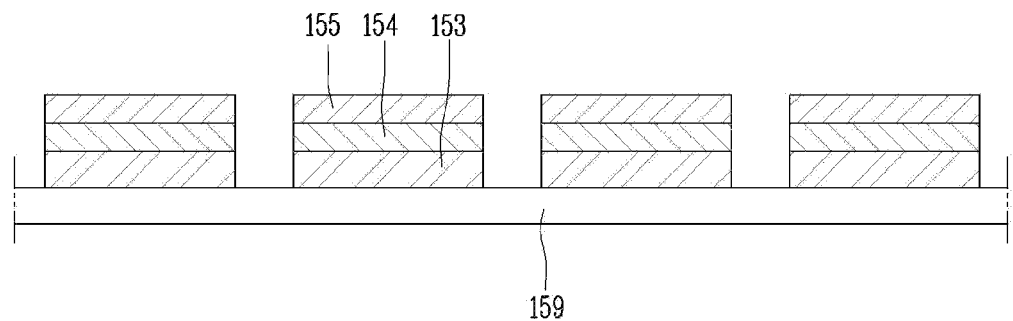

[FIG. 5c]
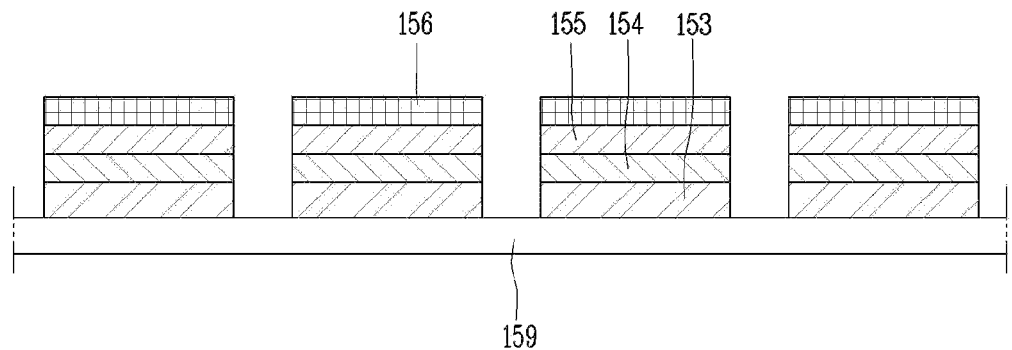
[FIG. 5d]
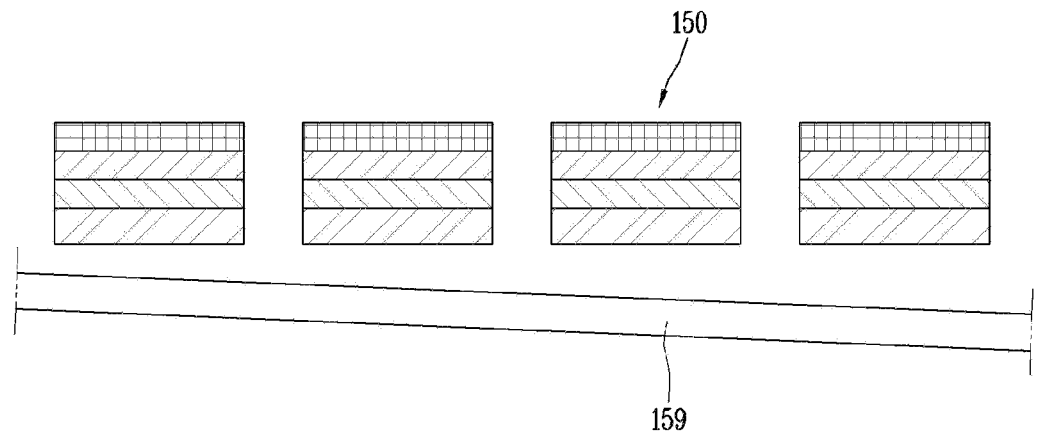
[FIG. 5e]
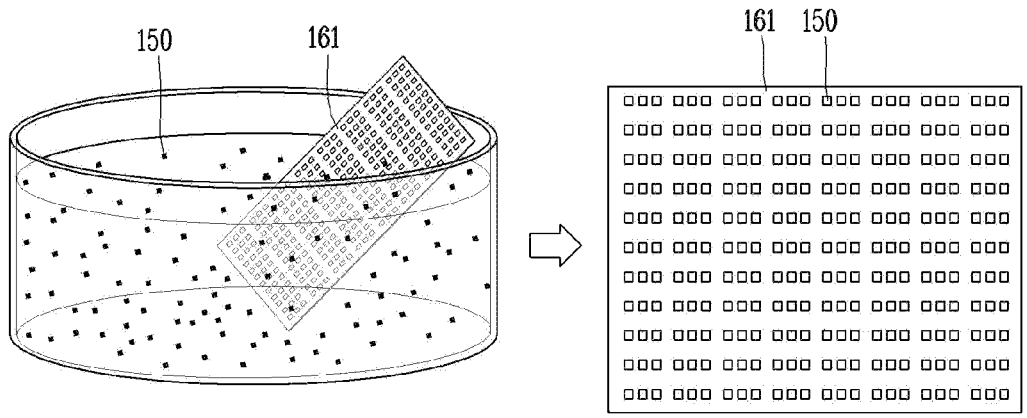

[FIG. 6]
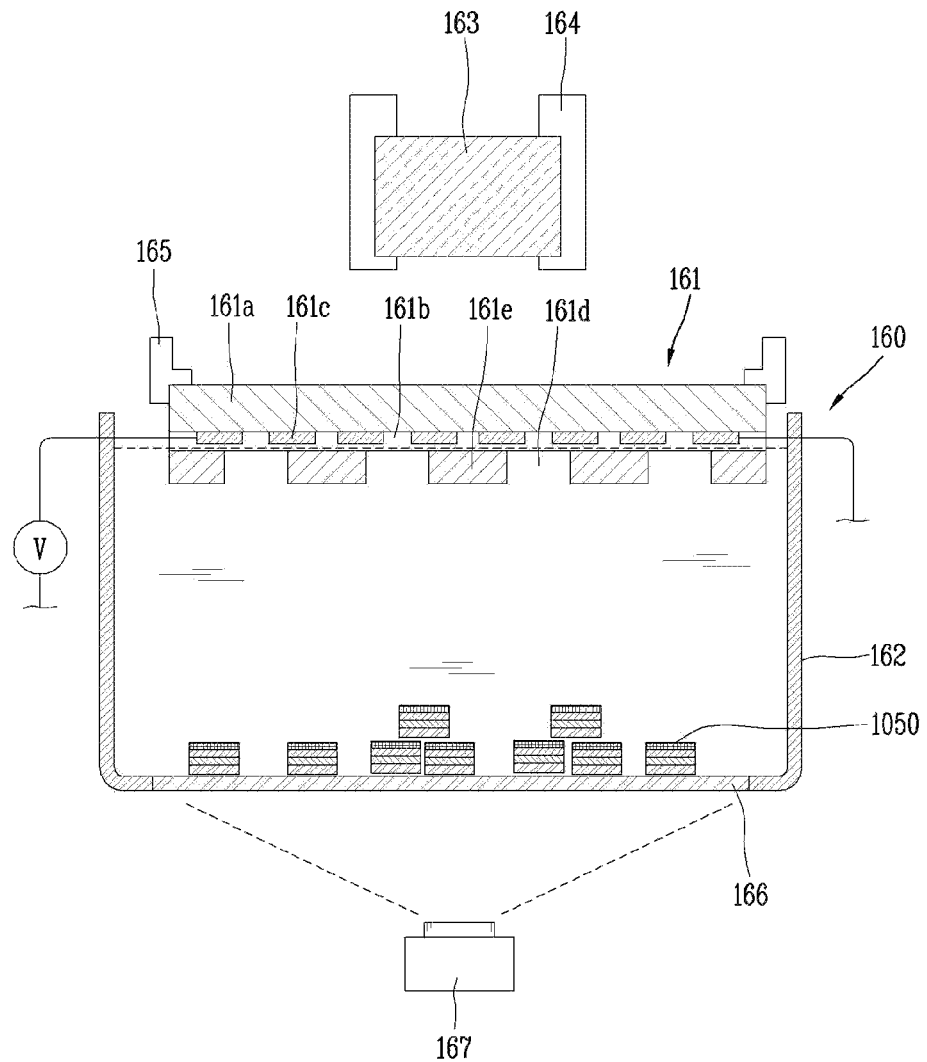

[FIG. 7]
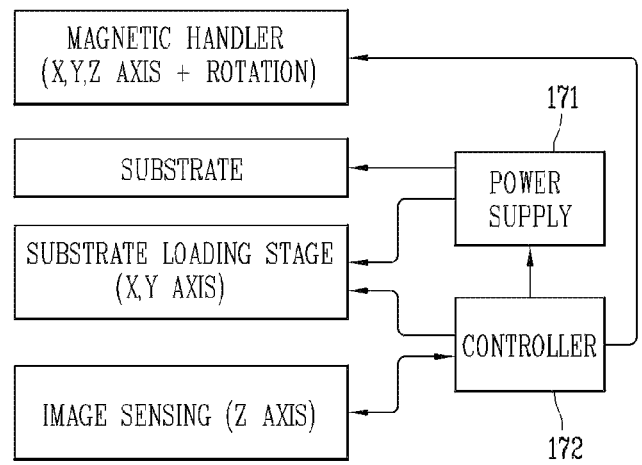
[FIG. 8a]
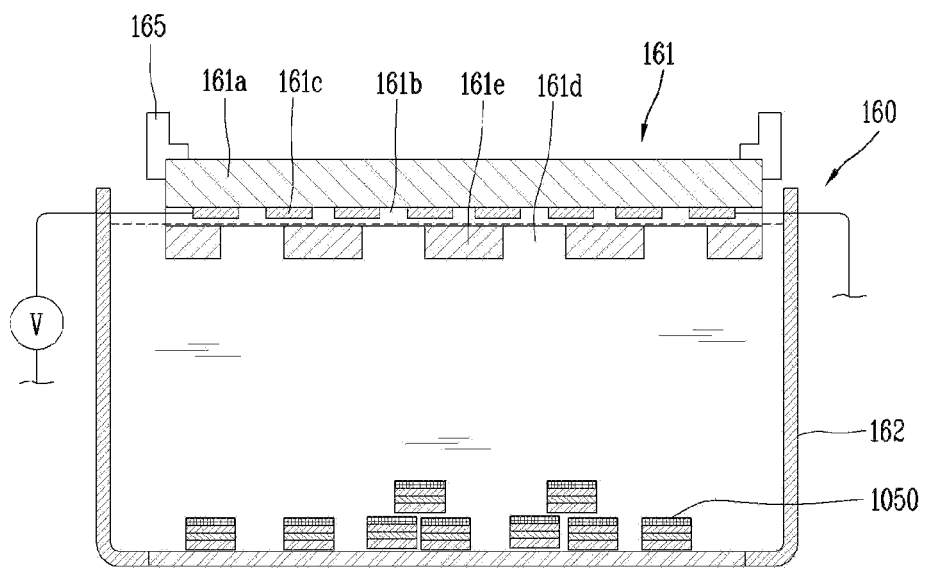

[FIG. 8b]
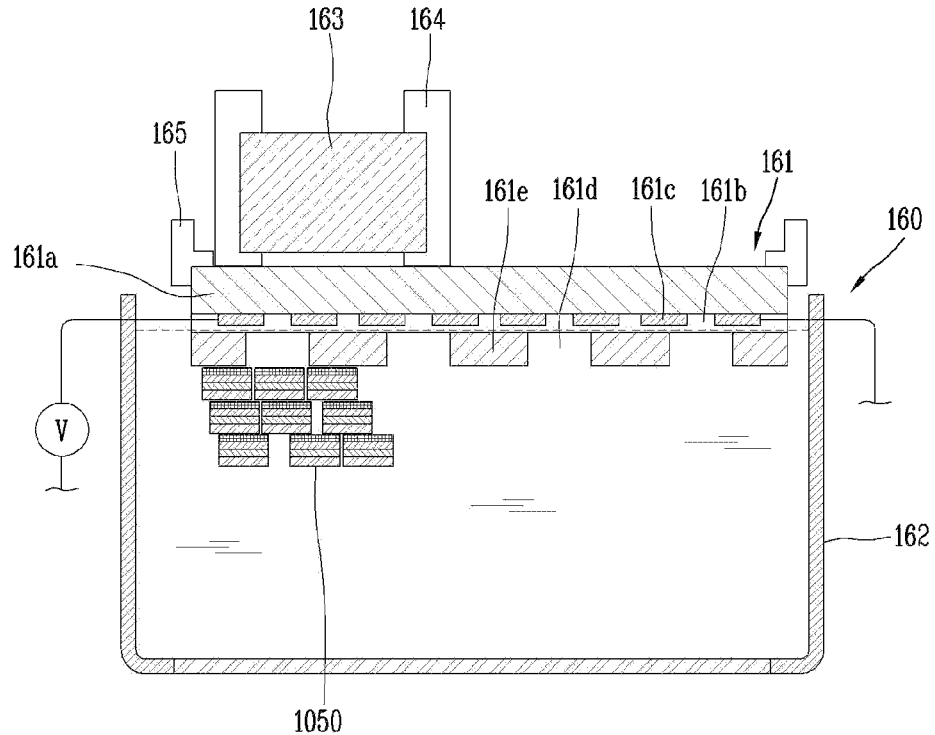
[FIG. 8c]
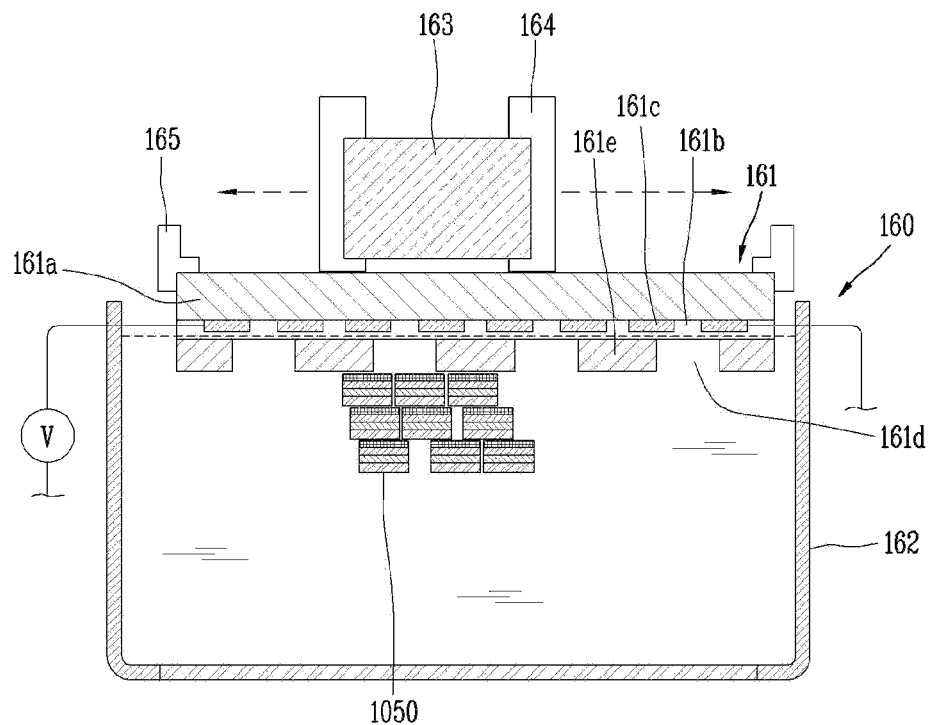

[FIG. 8d]
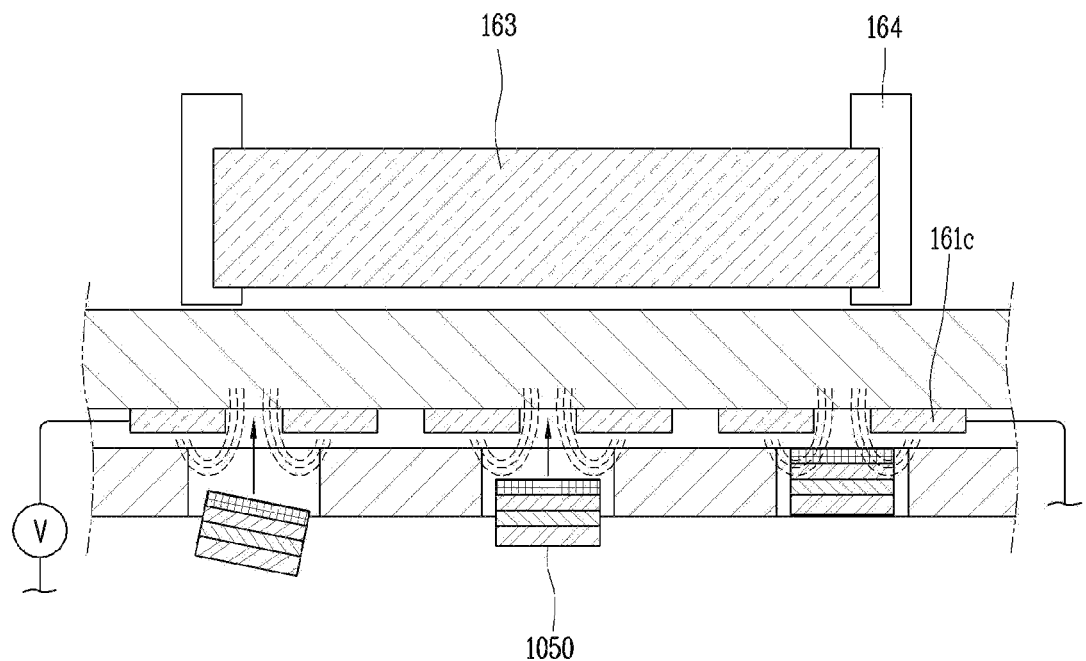
[FIG. 8e]
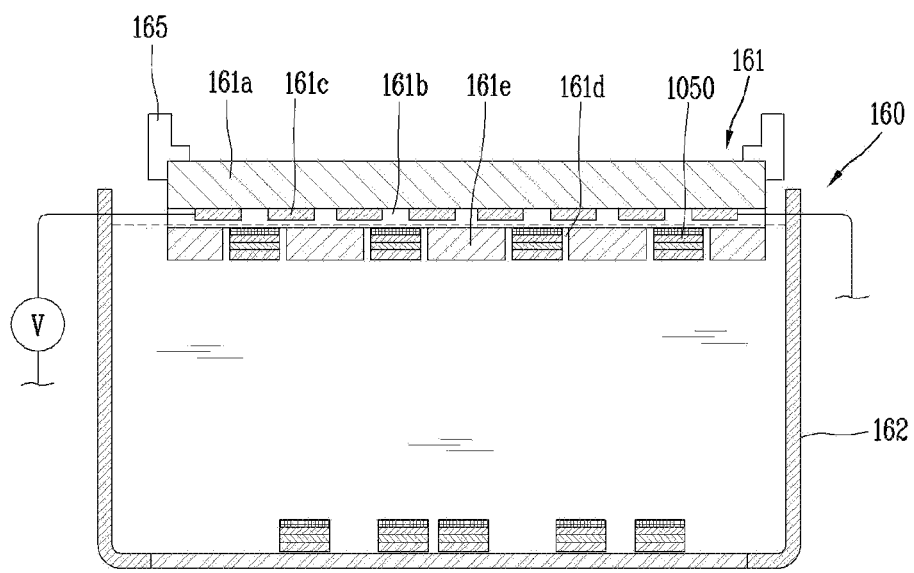

[FIG. 9]
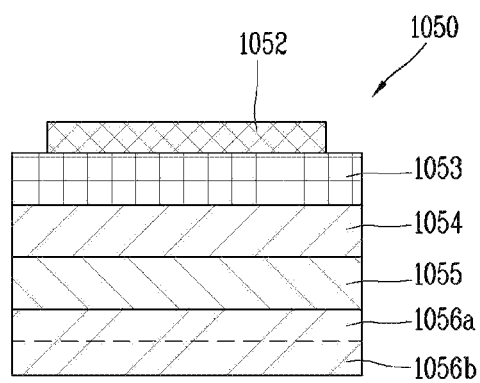

[FIG. 10]
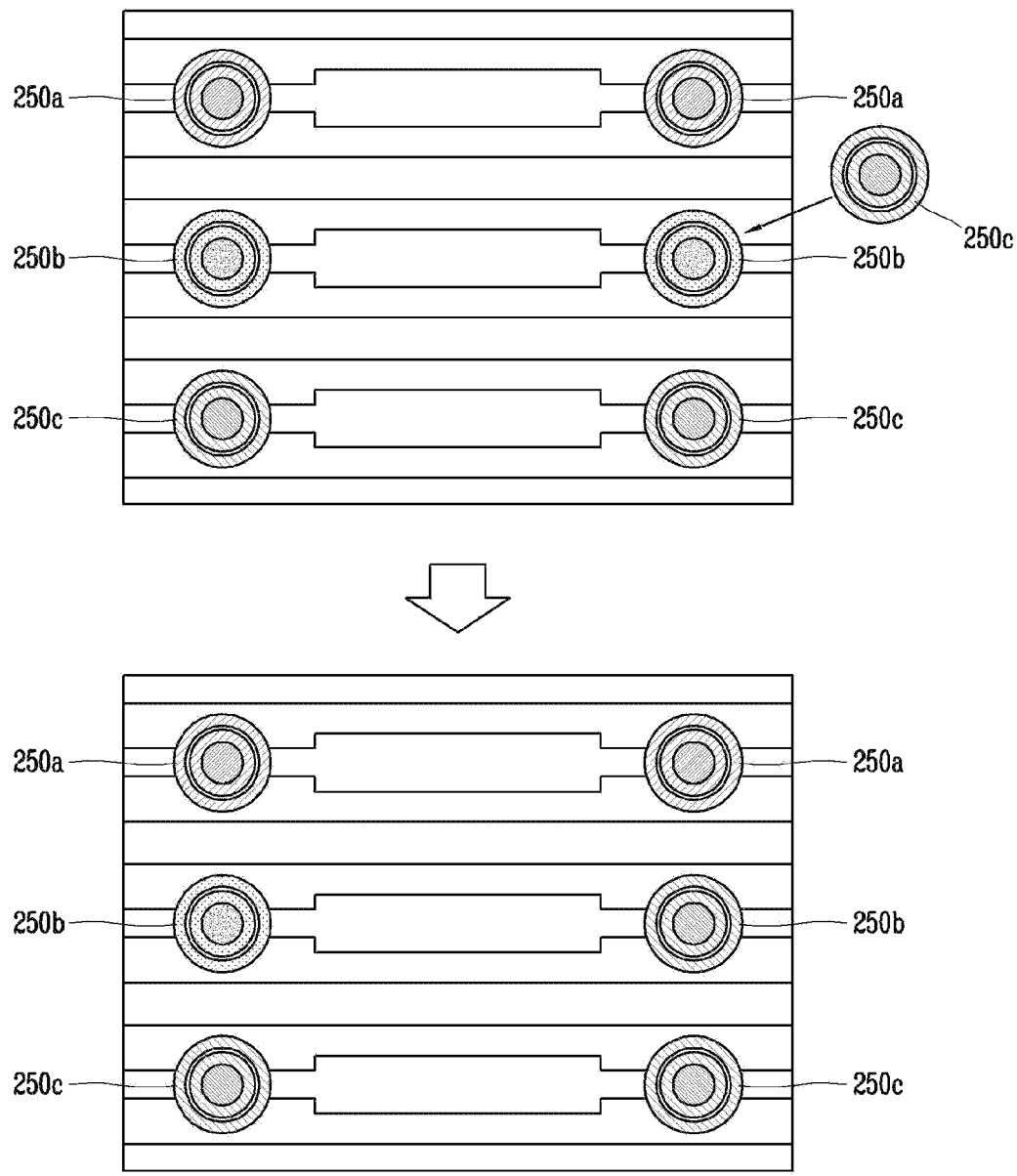

[FIG. 11]
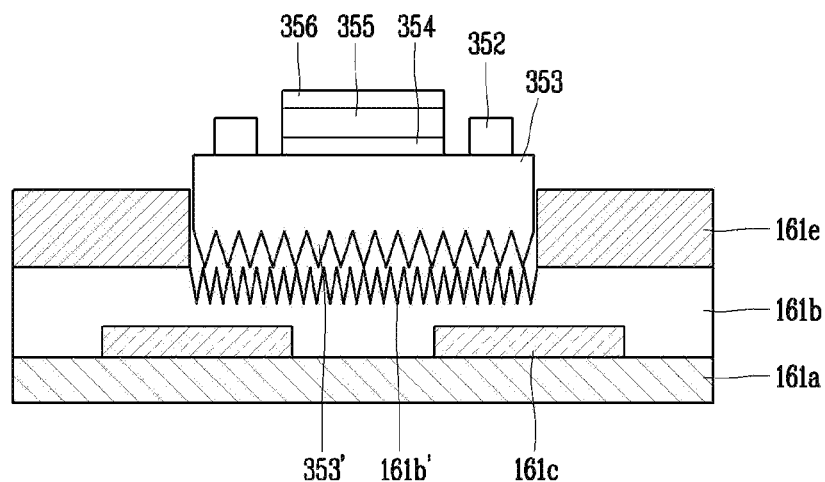

[FIG. 12]
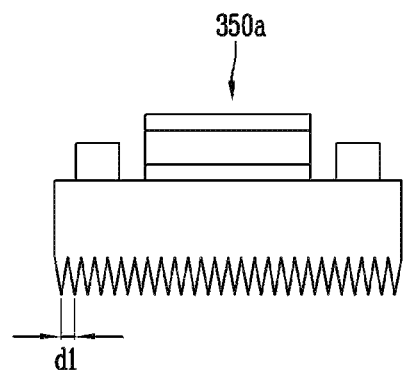
(a)
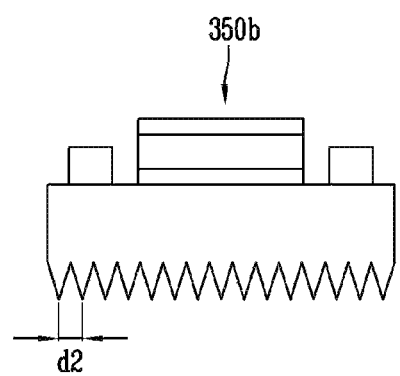
(b)
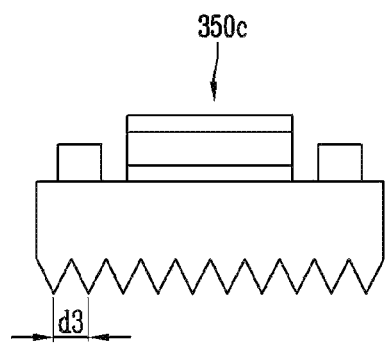
(c)

[FIG. 13]
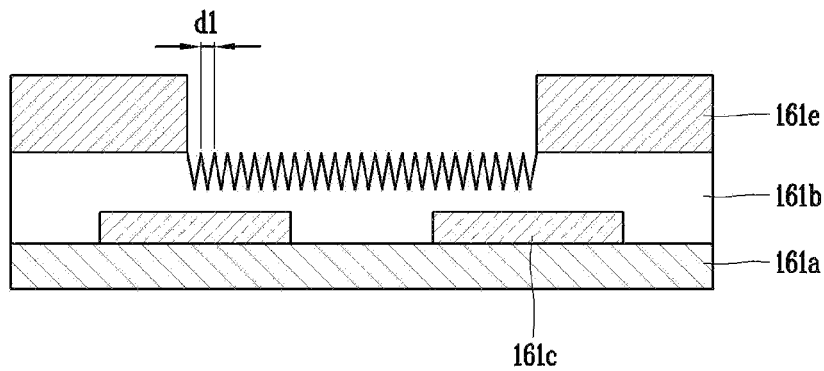
(a)
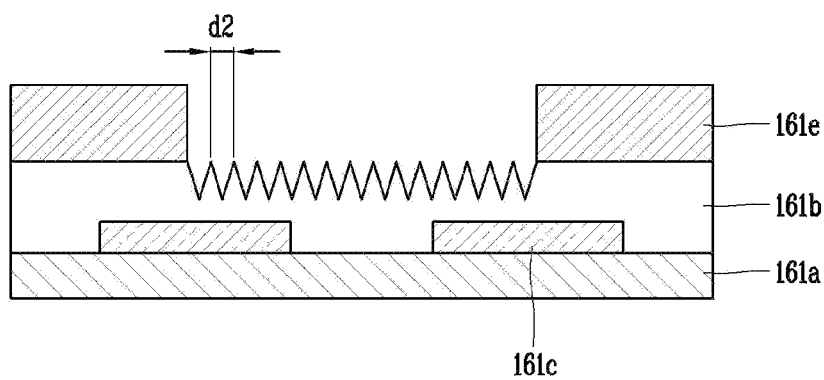
(b)
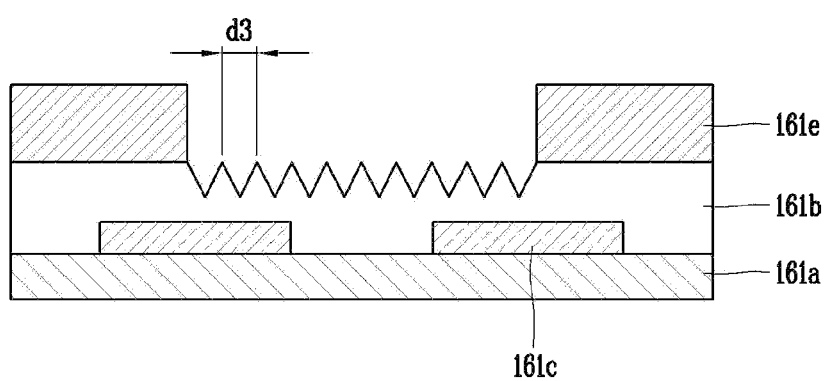
(c)

[FIG. 14]
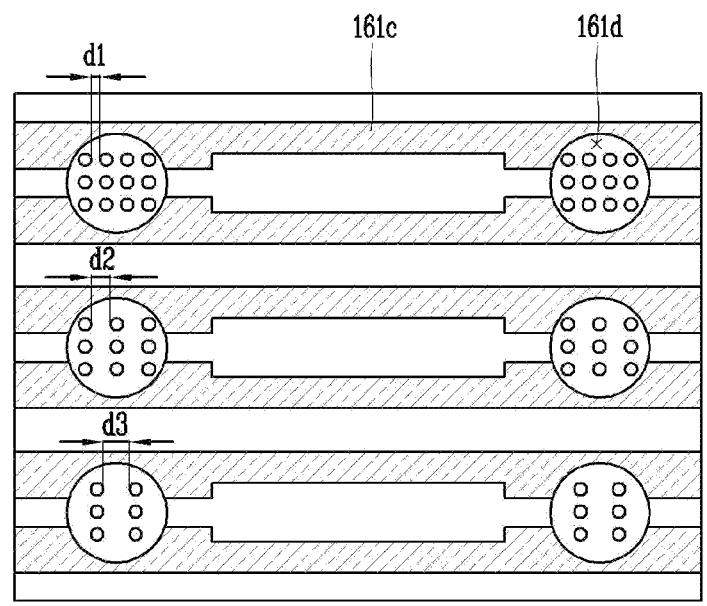

[FIG. 15]
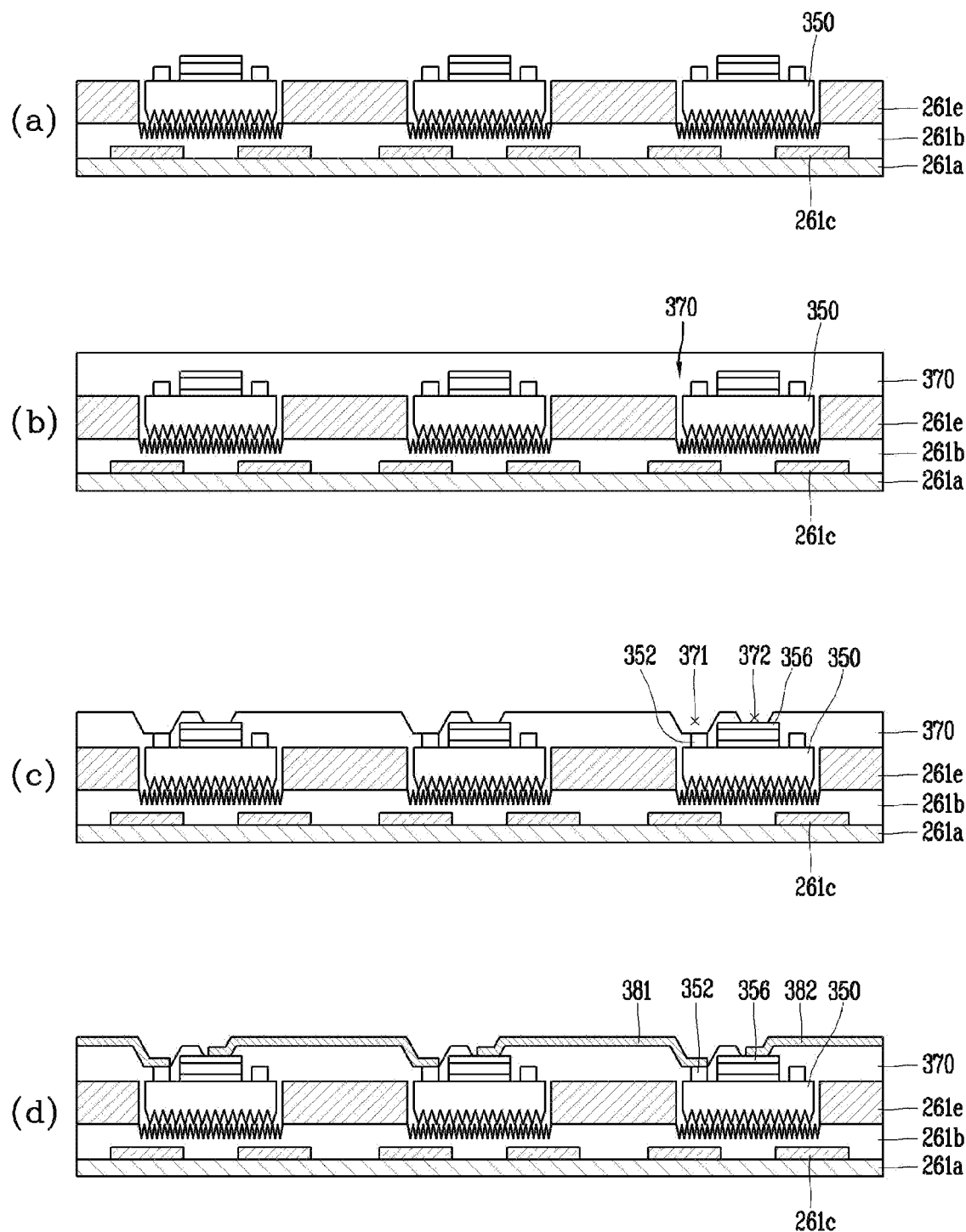

[FIG. 16]
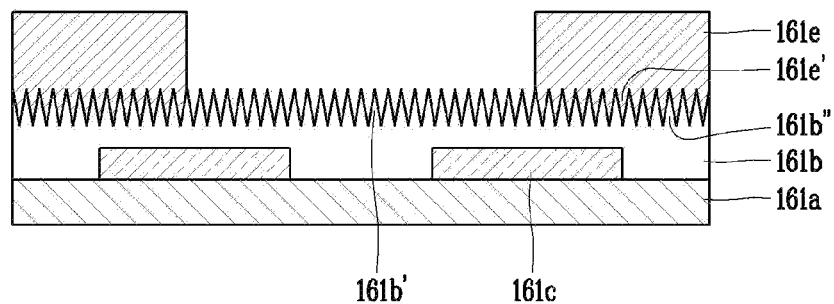

DISPLAY DEVICE USING MICRO LED

CROSS REFERENCE TO RELATED APPLICATIONS

This application is the National Stage filing under 35 U.S.C. 371 of International Application No. PCT/KR2020/001814, filed on Feb. 10, 2020, which claims the benefit of earlier filing date and right of priority to Korean Application No. 10-2019-0152574, filed on Nov. 25, 2019, the contents of all these applications are hereby incorporated by reference herein in their entirety.

TECHNICAL FIELD

The present invention relates to a method of manufacturing a display device using a semiconductor light emitting device having a size of several to several tens of μm, and a self-assembly device used therefor.

BACKGROUND ART

Recently, liquid crystal displays (LCD), organic light emitting device (OLED) displays, and micro LED displays are competing to implement large-area displays in the display technology field.

On the other hand, when a semiconductor light emitting device having a diameter or cross-sectional area of 100 μm or less (micro LED) is used for a display, a very high efficiency can be provided because the display does not absorb light using a polarizing plate or the like. However, since a large display requires millions of semiconductor light emitting devices, it is difficult to transfer the devices compared to other technologies.

The technologies currently being developed for the transfer process include a pick and place method, a laser lift-off (LLO) method, or a self-assembly method. Among them, the self-assembly method is a method in which the semiconductor light emitting device finds its own position in a fluid, and is the most advantageous method for realizing a large-screen display device.

Recently, although a micro LED structure suitable for self-assembly has been proposed in U.S. Pat. No. 9,825,202, research on a technology for manufacturing a display through self-assembly of micro LED is still insufficient. Accordingly, the present invention proposes a new type of manufacturing device in which the micro LED can be self-assembled.

DISCLOSURE

Technical Problem

An object of the present invention is to provide a new manufacturing process having high reliability in a large-screen display using a micro-sized semiconductor light emitting device.

Another object of the present invention is to provide a device for correcting a bending phenomenon of a substrate due to gravity when a semiconductor light emitting device is self-assembled into a temporary substrate or a wiring substrate.

Another object of the present invention is to provide a structure and a manufacturing method capable of preventing the semiconductor light emitting device from being separated from a substrate during a process after self-assembly of the semiconductor light emitting device.

Technical Solution

In order to achieve the above purpose, the present display device can include a base part, a plurality of assembly electrodes disposed on the base part, and having a first electrode and a second electrode that generate an electric field when power is applied, a dielectric layer formed to cover the assembly electrodes and a plurality of semiconductor light emitting devices seated on a surface of the dielectric layer, concave-convex structure respectively formed on one surface of the semiconductor light emitting device facing the dielectric layer and one surface of the dielectric layer facing the semiconductor light emitting device.

In an embodiment, the concave-convex structures formed on each of the semiconductor light emitting device and the dielectric layer may be arranged to engage with each other.

In an embodiment, the passivation layer may be disposed on the dielectric layer and include a plurality of cells, and the semiconductor light emitting devices may be disposed inside the cell.

In an embodiment, the concave-convex structure formed on the dielectric layer may be formed only in a region overlapping the cell.

In an embodiment, the concave-convex structure formed on the dielectric layer may be formed to overlap at least a portion of the passivation layer.

In an embodiment, the concave-convex structure formed on each of the semiconductor light emitting device and the dielectric layer may be formed at a predetermined interval.

In one embodiment, the plurality of semiconductor light emitting devices may include a first semiconductor light emitting device including a concave-convex structure formed at first interval and a second semiconductor light emitting device including a concave-convex structure formed at second interval.

In an embodiment, the dielectric layer may include a concave-convex structure formed at the first interval and a concave-convex structure formed at the second interval, respectively.

In one embodiment, the concave-convex structure formed on the semiconductor light emitting device may be made of any one of Au, Ag, Al, Cu, Mo, Cr, Ti, Ni, W, Ge, or an alloy in which at least some of the metals are mixed.

In an embodiment, the concave-convex structure formed on the dielectric layer may be made of a metal oxide or made of the same material as the dielectric layer.

Effects of the Invention

According to the present invention having the above configuration, in a display device in which individual pixels are formed of micro light emitting diodes, a large number of semiconductor light emitting devices can be assembled at once.

As described above, according to the present invention, after pixelate a large amount of semiconductor light emitting devices on a small-sized wafer, it is possible to transfer semiconductor light emitting devices to a large-area substrate. Through this, it is possible to manufacture a large-area display device at a low cost.

In addition, according to the present invention, by using magnetic and electric fields in solution to simultaneously transfer semiconductor light emitting devices in place, it is possible to implement low-cost, high-efficiency, and high-speed transfer regardless of the size, number, or transfer area of parts.

Also, according to the present invention, by increasing the contact area between the semiconductor light emitting device and the dielectric layer, the magnitude of the van der Waals attractive force acting between the semiconductor light emitting device and the dielectric layer and the electric force acting on the semiconductor light emitting device can be increased. Through this, the present invention can prevent the pre-assembled semiconductor light emitting devices from being separated from the substrate.

In addition, according to the present invention, by diffusely reflecting the light directed to the dielectric layer in the opposite direction, the amount of light of the display device can be increased.

In addition, according to the present invention, by increasing the contact area between the semiconductor light emitting device and the dielectric layer, heat generated in the semiconductor light emitting device can be rapidly transferred to the dielectric layer. Through this, the present invention can improve the heat dissipation efficiency of the display device.

DESCRIPTION OF DRAWINGS

FIG. 1 is a conceptual diagram showing an embodiment of a display device using a semiconductor light emitting device of the present invention.

FIG. 2 is a partially enlarged view of a portion A of the display device of FIG. 1.

FIG. 3 is an enlarged view of the semiconductor light emitting device of FIG. 2.

FIG. 4 is an enlarged view illustrating another embodiment of the semiconductor light emitting device of FIG. 2.

FIGS. 5A to 5E are conceptual views for explaining a new process of manufacturing the above-described semiconductor light emitting device.

FIG. 6 is a conceptual diagram illustrating an example of a device for self-assembly of a semiconductor light emitting device according to the present invention.

FIG. 7 is a block diagram of the self-assembly device of FIG. 6.

FIGS. 8A to 8E are conceptual views illustrating a process of self-assembling a semiconductor light emitting device using the self-assembly device of FIG. 6.

FIG. 9 is a conceptual diagram illustrating the semiconductor light emitting device of FIGS. 8A to 8E.

FIG. 10 is a conceptual diagram illustrating a state in which a pre-assembled semiconductor light emitting device is separated from a substrate during self-assembly.

FIG. 11 is a conceptual diagram illustrating a cross-section of a display device according to the present invention.

FIG. 12 is a conceptual diagram illustrating a cross-section of a semiconductor light emitting device according to an embodiment of the present invention.

FIG. 13 is a conceptual diagram illustrating a cross-section of a substrate according to an embodiment of the present invention.

FIG. 14 is a top view of a substrate according to an embodiment of the present invention.

FIG. 15 illustrates states in manufacturing a display device according to an embodiment of the present invention.

FIG. 16 illustrates a state of manufacturing a display device according to an embodiment of the present invention.

DETAILED DESCRIPTION OF THE INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies may obscure the gist of the embodiments disclosed in the present specification, the detailed description thereof will be omitted. Also, it should be noted that the accompanying drawings are only for easy understanding of the embodiments disclosed in the present specification, and should not be construed as limiting the technical spirit disclosed in the present specification by the accompanying drawings.

Also, when an element, such as a layer, region, or substrate, is referred to as being 'on' another component, it may be directly on other elements or intervening elements may exist in between.

The display device described in this specification includes a mobile phone, a smart phone, a laptop computer, a digital broadcasting terminal, a personal digital assistant (PDA), a portable multimedia player (PMP), a navigation system, a slate PC, a Tablet PC, a Ultra Book, a digital TV, a digital signage, a head mounted display (HMD), a desktop computer, and the like. However, it will be easily understood by those skilled in the art that the configuration according to the embodiments described in the present specification may be applied to a device capable of displaying even in a new product form to be developed later.

FIG. 1 is a conceptual diagram showing an embodiment of a display device using a semiconductor light emitting device of the present invention. FIG. 2 is a partial enlarged view of part A of the display device of FIG. 1. FIG. 3 is an enlarged view of the semiconductor light emitting device of FIG. 2. FIG. 4 is an enlarged view illustrating another embodiment of the semiconductor light emitting device of FIG. 2.

As illustrated, information processed by the control unit of the display device 100 may be output from the display module 140. A closed-loop case 101 surrounding an edge of the display module may form a bezel of the display device.

The display module 140 may include a panel 141 on which an image is displayed, and the panel 141 may include a micro-sized semiconductor light emitting device 150 and a wiring board 110 on which the semiconductor light emitting device 150 is mounted.

A wiring is formed on the wiring board 110 to may be connected to the n-type electrode 152 and the p-type electrode 156 of the semiconductor light emitting device 150. Through this, the semiconductor light emitting device 150 may be provided on the wiring board 110 as an individual pixel that emits light.

The image displayed on the panel 141 is visual information, and is implemented by independently controlling the light emission of sub-pixels arranged in a matrix form through the wiring.

In the present invention, a micro LED (Light Emitting Diode) is exemplified as a type of the semiconductor light emitting device 150 that converts current into light. The micro LED may be a light emitting diode formed in a small size of 100 micrometers or less. In the semiconductor light emitting device 150, blue, red, and green colors are respectively provided in the light emitting region, and a unit pixel may be realized by a combination thereof. That is, the unit pixel means a minimum unit for implementation one color, and at least three micro LEDs may be provided in the unit pixel.

More specifically, referring to FIG. 3, the semiconductor light emitting device 150 may have a vertical structure.

For example, the semiconductor light-emitting device 150 may be implemented as a high-output light-emitting device that emits various types of light, including blue, by mainly using gallium nitride (GaN) and adding indium (In) and/or aluminum (Al) together.

Such a vertical semiconductor light emitting device can include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 may be electrically connected to the p-electrode of the wiring board, and the upper n-type electrode 152 may be electrically connected to the n-electrode at the upper side of the semiconductor light emitting device. The vertical semiconductor light emitting device 150 has a great advantage in that it is possible to reduce the chip size because electrodes can be arranged up and down.

As another example, referring to FIG. 4, the semiconductor light emitting device may be a flip chip type light emitting device.

As an example, the semiconductor light emitting device 150' can include a p-type electrode 156', a p-type semiconductor layer 155' on which the p-type electrode 156' is formed, an active layer 154' formed on the p-type semiconductor layer 155', an n-type semiconductor layer 153' formed on the active layer 154', and an n-type electrode 152' that is horizontally spaced apart from the p-type electrode 156' on the n-type semiconductor layer 153'. In this case, both the p-type electrode 156' and the n-type electrode 152' may be electrically connected to the p-electrode and the n-electrode of the wiring board under the semiconductor light emitting device.

The vertical semiconductor light emitting device and the horizontal semiconductor light emitting device may be a green semiconductor light emitting device, a blue semiconductor light emitting device, or a red semiconductor light emitting device, respectively. In the case of a green semiconductor light emitting device and a blue semiconductor light emitting device, gallium nitride (GaN) are mainly used, and indium (In) and/or aluminum (Al) are added together to be implemented as a high-output light emitting device emitting green or blue light. For example, the semiconductor light emitting device may be a gallium nitride thin film formed in various layers such as n-Gan, p-Gan, AlGaN, InGan, and the like. Specifically, the p-type semiconductor layer may be P-type GaN, and the n-type semiconductor layer may be N-type GaN. However, in the case of a red semiconductor light emitting device, the p-type semiconductor layer may be P-type GaAs, and the n-type semiconductor layer may be N-type GaAs.

Also, the p-type semiconductor layer may be P-type GaN doped with Mg on the p-electrode side, and the n-type semiconductor layer may be N-type GaN doped with Si on the n-electrode side. In this case, the above-described semiconductor light emitting devices may be semiconductor light emitting devices without an active layer.

Meanwhile, referring to FIGS. 1 to 4, since the light emitting diode can be very small, unit pixels that emit self-luminescence can be arranged in a high definition in the display panel, thereby realizing a high-definition display device.

In the display device using the semiconductor light emitting device of the present invention described above, the semiconductor light emitting device grown on a wafer and formed through mesa and isolation can be used as an individual pixel. In this case, the micro-sized semiconductor light emitting device 150 should be transferred to a pre-set position on the substrate of the display panel on the wafer. There is a pick and place method as such a transfer technology, but the success rate is low and a lot of time is required. As another example, there is a technique of transferring several devices at once using a stamp or a roll, but there is a limit to the yield, which is not suitable for a large screen display. The present invention proposes a new manufacturing method and manufacturing device of a display device that can solve these problems.

To this end, hereinafter, a new method of manufacturing a display device will be described. FIGS. 5A to 5E are conceptual views for explaining anew process of manufacturing the above-described semiconductor light emitting device.

In the present specification, a display device using a passive matrix (PM) type semiconductor light emitting device is exemplified. However, the examples described below are also applicable to an active matrix (AM) type semiconductor light emitting device. In addition, although a method of self-assembling a horizontal semiconductor light emitting device is exemplified, it is also applicable to a method of self-assembling a vertical semiconductor light emitting device.

First, according to the manufacturing method, the first conductivity type semiconductor layer 153, the active layer 154, and the second conductivity type semiconductor layer 155 are grown on the growth substrate 159, respectively (refer to FIG. 5A).

When the first conductivity type semiconductor layer 153 is grown, next, an active layer 154 can be grown on the first conductivity type semiconductor layer 153, next, a second conductivity type semiconductor layer 155 can be grown on the active layer 154. In this way, when the first conductivity type semiconductor layer 153, the active layer 154, and the second conductivity type semiconductor layer 155 can be sequentially grown, as shown in FIG. 5A, the first conductivity type semiconductor layer 153, the active layer 154, and the second conductivity type semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present invention is not necessarily limited thereto, and examples in which the first conductivity type can be n-type and the second conductivity type is p-type can be also possible.

In addition, although the case in which the active layer is present is exemplified in this embodiment, a structure without the active layer is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire ($Al_2O_3$), GaN, ZnO, or AlO, but is not limited thereto. In addition, the growth substrate 1059 may be formed of a material suitable for semiconductor material growth, a carrier wafer. Also, it can be formed of a material with excellent thermal conductivity, including a conductive substrate or an insulating substrate, for example, at least one of Si, GaAs, GaP, InP, and Ga2O3 or a SiC substrate having higher thermal conductivity than a sapphire (Al2O3) substrate may be used.

Next, at least some of the first conductivity type semiconductor layer 153, the active layer 154, and the second conductivity type semiconductor layer 155 are removed to form a plurality of semiconductor light emitting devices (refer to FIG. 5B).

More specifically, isolation is performed so that a plurality of light emitting devices can form a light emitting device array. That is, the first conductivity type semiconductor layer 153, the active layer 154, and the second conductivity type semiconductor layer 155 can be vertically etched to form a plurality of semiconductor light emitting devices.

If a horizontal semiconductor light emitting device is formed, the active layer 154 and the second conductivity type semiconductor layer 155 are partially removed in the vertical direction, a mesa process in which the first conductivity type semiconductor layer 153 is exposed to the outside, and an isolation process in which the first conductivity type semiconductor layer is etched to form a plurality of semiconductor light emitting device arrays may be performed thereafter.

Next, second conductive electrodes 156 (or p-type electrodes) are respectively formed on one surface of the second conductivity type semiconductor layer 155 (refer to FIG. 5C). The second conductive electrode 156 may be formed by a deposition method such as sputtering, but the present invention is not limited thereto. However, when the first conductivity type semiconductor layer and the second conductivity type semiconductor layer are an n-type semiconductor layer and a p-type semiconductor layer, respectively, the second conductive electrode 156 may be an n-type electrode.

Next, the growth substrate 159 is removed to provide a plurality of semiconductor light emitting devices. For example, the growth substrate 1059 may be removed using a laser lift-off (LLO) method or a chemical lift-off (CLO) method (refer to FIG. 5D).

Thereafter, a step of seating the semiconductor light emitting devices 150 on a substrate in a chamber filled with a fluid is performed (refer to FIG. 5E).

For example, the semiconductor light emitting devices 150 and the substrate are put in a chamber filled with a fluid, and the semiconductor light emitting devices are self-assembled on the substrate 1061 using flow, gravity, surface tension, and the like. In this case, the substrate may be the assembly substrate 161.

As another example, it is also possible to put a wiring board in an assembly chamber instead of the assembly board 161 so that the semiconductor light emitting devices 150 are directly disposed on the wiring board. In this case, the substrate may be a wiring substrate. However, for convenience of description, in the present invention, the substrate is provided as the assembly substrate 161 to exemplify that the semiconductor light emitting devices 1050 are mounted.

Cells (not shown) in which the semiconductor light emitting devices 150 are inserted may be provided in the assembly substrate 161 to facilitate mounting of the semiconductor light emitting devices 150 on the assembly substrate 161. Specifically, cells in which the semiconductor light emitting devices 150 are disposed are formed on the assembly substrate 161 at positions where the semiconductor light emitting devices 150 are aligned with the wiring electrodes. The semiconductor light emitting devices 150 are assembled to the cells while moving in the fluid.

After arranging a plurality of semiconductor light emitting devices on the assembly substrate 161, if the semiconductor light emitting devices of the assembly substrate 161 are transferred to a wiring board, large-area transfer is possible. Accordingly, the assembly substrate 161 may be referred to as a temporary substrate.

On the other hand, in order to apply the self-assembly method described above to the manufacture of a large-screen display, it is necessary to increase the transfer yield. The present invention proposes a method and device for minimizing the influence of gravity or frictional force and preventing non-specific binding in order to increase the transfer yield.

In this case, in the display device according to the present invention, a magnetic material can be disposed on a semiconductor light emitting device to move the semiconductor light emitting device using magnetic force, and the semiconductor light emitting device is disposed at a pre-set position by using an electric field during the movement process. Hereinafter, such a transfer method and device will be described in more detail with the accompanying drawings.

FIG. 6 is a conceptual diagram illustrating an example of a self-assembly device for a semiconductor light emitting device according to the present invention, and FIG. 7 is a block diagram of the self-assembly device of FIG. 6. FIGS. 8A to 8D are conceptual views illustrating a process of self-assembly a semiconductor light emitting device using the self-assembly device of FIG. 6, and FIG. 9 is a conceptual diagram for explaining the semiconductor light emitting device of FIGS. 8A to 8D.

Referring to FIGS. 6 and 7, the self-assembly device 160 of the present invention may include the assembly chamber 162, a magnet 163, and a position control unit 164.

The assembly chamber 162 can have a space for accommodating a plurality of semiconductor light emitting devices. The space may be filled with a fluid, and the fluid may include water as an assembly solution. Accordingly, the assembly chamber 162 may be a water tank and may be configured as an open type. However, the present invention is not limited thereto, and the assembly chamber 162 may be of a closed type in which the space is a closed space.

In the assembly chamber 162, the substrate 161 may be disposed such that an assembly surface on which the semiconductor light emitting devices 150 are assembled faces downward. For example, the substrate 161 may be transferred to an assembly position by a transfer unit, and the transfer unit may include a stage 165 on which the substrate is mounted. The position of the stage 165 can be adjusted by the controller, and through this, the substrate 161 may be transferred to the assembly position.

At this time, the assembly surface of the substrate 161 can face the bottom of the assembly chamber 150 in the assembly position. As shown, the assembly surface of the substrate 161 can be arranged to be immersed in the fluid in the assembly chamber 162. Accordingly, the semiconductor light emitting device 150 can move to the assembly surface in the fluid.

The substrate 161 can be an assembly substrate capable of forming an electric field, and may include a base part 161a, a dielectric layer 161b, and a plurality of electrodes 161c.

The base part 161a may be made of an insulating material, and the plurality of electrodes 161c may be thin film or thick film bi-planar electrodes patterned on one surface of the base part 161a. The electrode 161c may be formed of, for example, a stack of Ti/Cu/Ti, Ag paste, ITO, or the like.

The dielectric layer 161b may be made of an inorganic material such as $SiO_2$, $SiN_x$, SiON, $Al_2O_3$, $TiO_2$, $HfO_2$, or the like. Alternatively, the dielectric layer 161b may be formed of a single layer or a multi-layer as an organic insulator. The thickness of the dielectric layer 161b may be in the range of several tens of nm to several μm.

Furthermore, the substrate 161 according to the present invention can include a plurality of cells 161d partitioned by barrier wall. The cells 161d can be sequentially arranged in one direction and may be made of a polymer material. Also, the barrier wall 161e forming the cells 161d are shared with the neighboring cells 161d. The barrier wall 161e can protrude from the base part 161a, and the cells 161d may be sequentially disposed along one direction by the barrier wall 161e. More specifically, the cells 161d may be sequentially arranged in the column and row directions, respectively, and may have a matrix structure.

Inside the cells 161d, as shown, a groove for accommodating the semiconductor light emitting device 150 is provided, and the groove may be a space defined by the barrier wall 161e. The shape of the groove may be the same as or similar to that of the semiconductor light emitting device. For example, when the semiconductor light emitting device has a rectangular shape, the groove may have a rectangular shape. Also, although not shown, when the semiconductor light emitting device has a circular shape, the grooves formed in the cells may have a circular shape. Furthermore, each of the cells is configured to accommodate a single semiconductor light emitting device. That is, one semiconductor light emitting device is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c can be disposed below the cells 161d, and different polarities are applied to each other to generate an electric field in the cells 161d. To form the electric field, the dielectric layer may form the bottom of the cells 161d while covering the plurality of electrodes 161c with the dielectric layer. In this structure, when different polarities are applied to the pair of electrodes 161c under each of the cells 161d, an electric field may be formed, and the semiconductor light emitting device may be inserted into the cells 161d by the electric field.

In the assembly position, the electrodes of the substrate 161 are electrically connected to the power supply unit 171. The power supply unit 171 applies power to the plurality of electrodes to generate the electric field.

As shown, the self-assembly device may include a magnet 163 for applying a magnetic force to the semiconductor light emitting devices. The magnet 163 is spaced apart from the assembly chamber 162 to apply a magnetic force to the semiconductor light emitting devices 150. The magnet 163 can be disposed to face the opposite surface of the assembly surface of the substrate 161, and the position of the magnet is controlled by the position controller 164 connected to the magnet 163.

The semiconductor light emitting device 1050 may include a magnetic material to move in the fluid by the magnetic field of the magnet 163.

Referring to FIG. 9, in a semiconductor light emitting device including a magnetic material may include a first conductive electrode 1052 and a second conductive electrode 1056, a first conductivity type semiconductor layer 1053 on which the first conductive electrode 1052 is disposed, a second conductivity type semiconductor layer 1055 overlapping the first conductivity type semiconductor layer 1052 and on which the second conductive electrode 1056 is disposed, and an active layer 1054 disposed between the first and second conductivity type semiconductor layers 1053 and 1055.

Here, the first conductivity type may be a p-type, and the second conductivity type may be configured as an n-type, and vice versa. In addition, as described above, it may be a semiconductor light emitting device without the active layer.

Meanwhile, in the present invention, the first conductive electrode 1052 may be generated after the semiconductor light emitting device is assembled on the wiring board by self-assembly of the semiconductor light emitting device. Also, in the present invention, the second conductive electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided on the second conductive electrode 1056 in the form of particles. Alternatively, in a conductive electrode including a magnetic material, one layer of the conductive electrode may be formed of a magnetic material. For this example, as shown in FIG. 9, the second conductive electrode 1056 of the semiconductor light emitting device 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present invention is not necessarily limited thereto, and the magnetic material may be disposed on one surface of the first conductivity type semiconductor layer.

Referring back to FIGS. 6 and 7, more specifically, the self-assembly device may include a magnet handler capable of automatically or manually moving the x, y, and z axes on the upper portion of the assembly chamber, or a motor capable of rotating the magnet 163. The magnet handler and the motor may constitute the position control unit 164. Through this, the magnet 163 can rotate in a horizontal direction, clockwise or counterclockwise direction with the substrate 161.

Meanwhile, a light-transmitting bottom plate 166 may be formed in the assembly chamber 162, and the semiconductor light emitting devices may be disposed between the bottom plate 166 and the substrate 161. An image sensor 167 may be disposed to face the bottom plate 166 to monitor the inside of the assembly chamber 162 through the bottom plate 166. The image sensor 167 is controlled by the controller 172 and may include an inverted type lens and a CCD to observe the assembly surface of the substrate 161.

The self-assembly device described above is made to use a combination of a magnetic field and an electric field. Using this, the semiconductor light emitting devices can be mounted at a pre-set position on the substrate by an electric field while the semiconductor light emitting devices can be moved by a change in the position of the magnet. Hereinafter, the assembly process using the self-assembly device described above will be described in more detail.

First, a plurality of semiconductor light emitting devices 1050 including a magnetic material are formed through the process described with reference to FIGS. 5A to 5C. In this case, in the process of forming the second conductive electrode of FIG. 5C, a magnetic material may be deposited on the semiconductor light emitting device.

Next, the substrate 161 is transferred to the assembly position, and the semiconductor light emitting devices 1050 are put into the assembly chamber 162 (refer to FIG. 8A).

As described above, the assembly position of the substrate 161 may be a position in which the assembly surface of the substrate 161 on which the semiconductor light emitting devices 1050 are assembled faces downward in the assembly chamber 162.

In this case, some of the semiconductor light emitting devices 1050 may sink to the bottom of the assembly chamber 162 and some may float in the fluid. When the light-transmitting bottom plate 166 is provided in the assembly chamber 162, some of the semiconductor light emitting devices 1050 may sink to the bottom plate 166.

Next, a magnetic force is applied to the semiconductor light emitting devices 1050 so that the semiconductor light emitting devices 1050 vertically float in the assembly chamber 162 (refer to FIG. 8B).

When the magnet 163 of the self-assembly device moves from its original position to the opposite surface of the assembly surface of the substrate 161, the semiconductor light emitting devices 1050 are raised in the fluid toward the substrate 161. The original position may be a position deviated from the assembly chamber 162. As another example, the magnet 163 may be configured as an electromagnet. In this case, electricity is supplied to the electromagnet to generate an initial magnetic force.

Meanwhile, in this example, if the magnitude of the magnetic force is adjusted, the separation distance between the assembly surface of the substrate 161 and the semiconductor light emitting devices 1050 may be controlled. For example, the separation distance can be controlled using the weight, buoyancy, and magnetic force of the semiconductor light emitting devices 1050. The separation distance may be several millimeters to several tens of micrometers from the outermost surface of the substrate.

Next, a magnetic force is applied to the semiconductor light emitting devices 1050 so that the semiconductor light emitting devices 1050 move in one direction in the assembly chamber 162. For example, the magnet 163 moves in a direction parallel to the substrate, clockwise or counterclockwise (refer to FIG. 8C). In this case, the semiconductor light emitting devices 1050 move in a direction parallel to the substrate 161 at a position spaced apart from the substrate 161 by the magnetic force.

Next, in the process of moving the semiconductor light emitting devices 1050, a step of inducing the semiconductor light emitting devices 1050 to the pre-set position by applying an electric field so as to be disposed at a pre-set position of the substrate 161 is performed (refer to FIG. 8C). For example, while the semiconductor light emitting devices 1050 are moving in a direction horizontal to the substrate 161, and the semiconductor light emitting devices move in a direction perpendicular to the substrate 161 by the electric field and are disposed at a pre-set position on the substrate 161.

More specifically, a power can be supplied to the bi-planar electrode of the substrate 161 to generate an electric field, and by using this, assembly can be induced only at a pre-set position. That is, by using the selectively generated electric field, the semiconductor light emitting devices 1050 can be self-assembled at the assembly position of the substrate 161. To this end, cells in which the semiconductor light emitting devices 1050 are inserted may be provided on the substrate 161.

Thereafter, the unloading process of the substrate 161 proceeds, and the assembly process is completed. When the substrate 161 is the assembly substrate, a post-process for realizing a display device by transferring the semiconductor light emitting devices arranged as described above to a wiring board may be performed.

Meanwhile, after guiding the semiconductor light emitting devices 1050 to the pre-set position, the magnet 163 may be moved in a direction away from the substrate 161 so that the semiconductor light emitting devices 1050 remaining in the assembly chamber 162 fall to the bottom of the assembly chamber (refer to FIG. 8D). As another example, when power supply is stopped when the magnet 163 is an electromagnet, the semiconductor light emitting devices 1050 remaining in the assembly chamber 162 may fall to the bottom of the assembly chamber 162.

Thereafter, when the semiconductor light emitting devices 1050 at the bottom of the assembly chamber 162 are recovered, the recovered semiconductor light emitting devices 1050 can be reused.

To increase assembly yield in fluidic assembly, above the self-assembly device and method described can use a magnetic field to focus distant components near a pre-set assembly site, and can apply a separate electric field to the assembly site to selectively assemble components only at the assembly site. At this time, the assembly board can be placed on the upper part of the water tank and the assembly surface can be directed downward to minimize the effect of gravity due to the weight of the parts and prevent non-specific binding to eliminate defects. That is, to increase the transfer yield, the assembly substrate can be placed on the upper part to minimize the influence of gravity or frictional force, and non-specific binding can be prevented.

As described above, according to the present invention having the above configuration, in a display device in which individual pixels are formed of semiconductor light emitting devices, a large number of semiconductor light emitting devices can be assembled at once.

Meanwhile, as described with reference to FIGS. 8A to 8G, in the self-assembly method described above, semiconductor light emitting devices emitting light of different colors may be sequentially disposed on a substrate. In order to arrange the semiconductor light emitting devices emitting different colors on one substrate, the self-assembly process should be performed as many as the number of types of the semiconductor light emitting devices. For example, in order to dispose a semiconductor light emitting device emitting blue, red, and green light on one substrate, at least three self-assembly processes are required.

In this specification, an embodiment of assembling semiconductor light emitting devices emitting light of three types on one substrate is described, but the types of semiconductor light emitting devices assembled on one assembly substrate are not limited thereto. Hereinafter, semiconductor light emitting devices that emit light of different colors will be referred to as first to third semiconductor light emitting devices, and the first to third semiconductor light emitting devices can be sequentially assembled on the assembly substrate.

An electrode to which a voltage is applied can vary according to the type of the semiconductor light emitting device input to the fluid chamber. Hereinafter, the above-described electrode 161*c* will be referred to as an assembly electrode. Specifically, the plurality of assembly electrodes 161*c* can be divided into three groups. Hereinafter, the plurality of assembly electrodes can be divided into first to third groups.

During self-assembly, the first semiconductor light emitting devices can overlap any one of the assembly electrodes belonging to the first group. The second semiconductor light emitting devices can overlap any one of the assembly electrodes belonging to the second group. The third semiconductor light emitting devices can overlap any one of the assembly electrodes belonging to the third group.

When self-assembly is performed while the first semiconductor light emitting device is put into the fluid chamber, a voltage must be applied to the assembly electrode belonging to the first group. When self-assembly is performed while the second semiconductor light emitting device is put into the fluid chamber, a voltage must be applied to the assembly electrode belonging to the second group. When self-assembly is performed while the third semiconductor light emitting device is put into the fluid chamber, a voltage must be applied to the assembly electrode belonging to the third group.

However, in a state in which a specific semiconductor light emitting device is put into the fluid chamber, voltage need not to be applied only to the assembly electrode of a group corresponding to the specific semiconductor light emitting device. Specifically, when self-assembly is performed while the second semiconductor light emitting device is put into the fluid chamber, the first semiconductor light emitting device is already coupled to the substrate. In this case, when the voltage applied to the assembly electrode belonging to the first group is cut off, the first semiconductor light emitting device may be separated from the substrate. To prevent this, when self-assembly is performed while the second semiconductor light emitting device is inserted, voltage should be applied to both the first and second groups. In this case, an attractive force may act between the assembly electrodes belonging to the first group and the red semiconductor light emitting device, but since the first semiconductor light emitting devices are already disposed at designated positions, the second semiconductor light emitting devices are not disposed to overlap the assembly electrodes belonging to the first group.

Meanwhile, when the third semiconductor light emitting device is self-assembled, voltage should be applied to all of the first to third groups while the third semiconductor light emitting device is put into the fluid chamber.

However, the pre-assembled semiconductor light emitting device may be separated from the substrate even in a state where it is fixed by an electric field. For example, referring to FIG. 10, after self-assembly of the first semiconductor light-emitting device 250*a* and the second semiconductor light-emitting device 250*b* is completed, when self-assembly of the third semiconductor light-emitting device 250*c* is performed, the third semiconductor light emitting device 250*c* may collide with the pre-assembled second semiconductor light emitting device 250*b*. In this process, the pre-assembled semiconductor light emitting devices may be separated from the substrate.

In addition, the semiconductor light emitting device pre-assembled on the substrate may be separated from the substrate during the self-assembly process.

The present invention can provide a structure for preventing pre-assembled semiconductor light emitting devices from being separated from a substrate.

To this end, the present invention can include a base part, a plurality of assembly electrodes, a dielectric layer, and a plurality of semiconductor light emitting devices. The above-described components are substituted for the contents described with reference to FIGS. 1 to 9.

FIG. 11 is a conceptual diagram showing a cross section of the display device according to the present invention. FIG. 12 is a conceptual diagram illustrating a cross-section of a semiconductor light emitting device according to an embodiment of the present invention. FIG. 13 is a conceptual diagram illustrating a cross-section of a substrate according to an embodiment of the present invention. FIG. 14 is a top view of a substrate according to an embodiment of the present invention.

Referring to FIG. 11, the semiconductor light emitting devices 350 can be disposed on the surface of the dielectric layer 161*b*. Accordingly, one surface of the semiconductor light emitting device 350 is disposed to face the dielectric layer 161*b*, and one surface of the dielectric layer 161*b* is disposed to face the semiconductor layer 350. The semiconductor light emitting devices 350 can include a second conductive electrode 356, a second semiconductor layer 355, an active layer 354, a first semiconductor layer 353 and a first conductive electrode 352.

Hereinafter, for convenience of description, one surface of the semiconductor light emitting device 350 disposed to face the dielectric layer 161*b* is referred to as a lower surface of the semiconductor light emitting device 350. Meanwhile, one surface of the dielectric layer 161*b* disposed to face the semiconductor light emitting device 350 is referred to as an upper surface of the dielectric layer 161*b*.

To improve the bonding force between the semiconductor light emitting device 350 and the substrate 161, concave-convex structures 353' and 161*b*' can be formed on the lower surface of the semiconductor light emitting device 350 and the upper surface of the dielectric layer 161*b*, respectively. The concave-convex structures 353' and 161*b*' formed on each of the semiconductor light emitting device 350 and the dielectric layer 161*b* may be disposed to engage with each other. Specifically, the convex portion of the concave-convex structure 353' formed in the semiconductor light emitting device is disposed to fit into the concave portion of the concave-convex structure 161*b*' formed in the dielectric layer 161*b*. In addition, the convex portion of the concave-convex structure 161*b*' formed in the dielectric layer 161*b* is disposed to fit into the concave portion of the concave-convex structure 350' formed in the semiconductor light emitting device 350.

According to the above structure, the contact area between the semiconductor light emitting device 350 and the dielectric layer 161*b* can be increased. Accordingly, the van der Waals attraction formed between the semiconductor light emitting device 350 and the dielectric layer 161*b* can increase, and the coupling force between the semiconductor light emitting device 350 and the dielectric layer 161*b* can be improved.

Meanwhile, the above-described structure can affect not only the van der Waals attraction formed between the semiconductor light emitting device 350 and the dielectric layer 161b but also the magnitude of the electric force acting on the semiconductor light emitting device 350. Specifically, as the contact area between the semiconductor light emitting device 350 and the dielectric layer 161b can increase, the capacitance between the semiconductor light emitting device 350 and the assembly electrode 161c can increase. Accordingly, the magnitude of the electric force acting on the semiconductor light emitting device 350 can increase.

As described above, in the present invention, by increasing the contact area between the semiconductor light emitting device 350 and the dielectric layer 161b, van der Waals attractive force acting between the semiconductor light emitting device 350 and the dielectric layer 161b and the electric force acting on the semiconductor light emitting device 350 can be increased. Through this, the present invention can prevent the pre-assembled semiconductor light emitting devices from being separated from the substrate.

In addition to the above-described effects, the concave-convex structures can generate another effect. Specifically, the concave-convex structure formed on the lower surface of the semiconductor light emitting device 350 and the upper surface of the dielectric layer 161b can cause diffuse reflection of light. The light emission direction of the display device according to the present invention is the direction in which the upper surface of the dielectric layer faces. Accordingly, light directed to the upper surface of the dielectric layer can be lost light. The present invention can increase the amount of light of the display device by diffusely reflecting the light directed toward the upper surface of the dielectric layer in the opposite direction.

On the other hand, the present invention can increase the contact area between the semiconductor light emitting device 350 and the dielectric layer 161b, so that heat generated in the semiconductor light emitting device 350 can be rapidly transferred to the dielectric layer 161b. Through this, the present invention can improve the heat dissipation efficiency of the display device.

Meanwhile, the concave-convex structure may be made of various materials. Hereinafter, the material constituting the concave-convex structure will be described in detail.

The concave-convex structure formed on the lower surface of the semiconductor light emitting device may be made of a III-V compound semiconductor material capable of Epi growth in addition to GaAs, GaP, GaInP, AlInP, AlGaInP, GaN, AlGaN. In this case, the concave-convex structure may be formed when manufacturing a semiconductor light emitting device on a wafer.

Meanwhile, unlike the concave-convex structure shown in FIG. 11, the concave-convex structure formed in the semiconductor light emitting device may be formed as a layer separate from the conductivity type semiconductor layer provided in the semiconductor light emitting device. Specifically, the concave-convex structure formed on the lower surface of the semiconductor light emitting device may be made of any one of Au, Ag, Al, Cu, Mo, Cr, Ti, Ni, W, Ge, or an alloy in which at least some of the metals are mixed. Alternatively, the concave-convex structure may be formed of at least one of a metal oxide, for example, ZnO, SiO2, Al2O3, WOx, MoOx, TiO2, NiO, or CuOx.

When the concave-convex structure is made of any one of Au, Ag, Al, Cu, Mo, Cr, Ti, Ni, W, Ge, or is made of an alloy in which at least some of the metals are mixed, the magnitude of the electric force acting on the semiconductor light emitting device can be maximized.

Meanwhile, the concave-convex structure formed on the upper surface of the dielectric layer may be formed of at least one of a metal oxide, for example, ZnO, SiO2, Al2O3, WOx, MoOx, TiO2, NiO, or CuOx. Alternatively, the concave-convex structure formed on the upper surface of the dielectric layer may be made of the same material as that of the dielectric layer. In an embodiment, the concave-convex structure formed on the upper surface of the dielectric layer may be made of silicon nitride.

The concave-convex structure formed on each of the lower surface of the semiconductor light emitting device and the upper surface of the dielectric layer may be formed through wet etching, dry etching, etc. using beads, but the method of forming the concave-convex structure is not specifically limited.

Meanwhile, the concave-convex structure may be formed randomly or in a uniform pattern. Hereinafter, an embodiment in which the concave-convex structure is formed in a uniform pattern will be described.

FIG. 12 is a conceptual diagram illustrating a cross section of a semiconductor light emitting device according to an embodiment of the present invention, and FIG. 13 is a conceptual diagram illustrating a cross section of a substrate according to an embodiment of the present invention.

The concave-convex structure formed on each of the lower surface of the semiconductor light emitting device and the upper surface of the dielectric layer may be formed in a uniform pattern. Specifically, the concave-convex structure is a structure in which a convex region and a concave region are repeatedly formed. In each of the convex regions, a point farthest from the substrate (hereinafter referred to as the highest point) exists. The concave-convex structure may be formed such that a horizontal distance between the highest points is constant. Here, the horizontal distance between the peaks means a distance in a direction parallel to the dielectric layer, and the constant horizontal distance between the peaks means that the horizontal distance between the peaks is constant within a pre-set error range.

In the present specification, when the horizontal distance between the peaks is constant within a pre-set error range, it is expressed that the concave-convex structure is formed at a predetermined interval.

Referring to FIG. 12, the plurality of semiconductor light emitting devices may include a first semiconductor light emitting device 350a including a concave-convex structure formed at a first interval d1, a second semiconductor light emitting device 350b including a concave-convex structure formed at a second interval d2 and a third semiconductor light emitting device 350c including a concave-convex structure formed at a third interval d3. That is, the display device according to the present invention may include semiconductor light emitting devices having concave-convex structures of different patterns.

In an embodiment, different patterns of concave-convex structures may be formed for each light emitting color of the semiconductor light emitting device. Specifically, the concave-convex structures formed at first interval are formed in the semiconductor light emitting devices that emit light of the first color. Concave-convex structures formed at second interval are formed in the semiconductor light emitting devices that emit light of the second color. Concave-convex structures formed at third interval may be formed in the semiconductor light emitting devices emitting light of the third color.

On the other hand, referring to FIGS. 13 and 14, the dielectric layer may have a concave-convex structure formed at the first interval d1, a concave-convex structure formed at the second interval d2, and a concave-convex structure formed at the third interval d3, respectively. That is, the display device according to the present invention may include a dielectric layer having a concave-convex structure of different patterns on one surface.

A concave-convex structure having a pattern corresponding to the concave-convex structure formed in the semiconductor light emitting device may be formed in the dielectric layer. In an embodiment, when the semiconductor light emitting device emitting light of the first to third colors is assembled on one substrate, three types of concave-convex structures may be formed on the dielectric layer.

When the concave-convex structure of the same interval is formed in each of the semiconductor light emitting device and the dielectric layer, the semiconductor light emitting device may be selectively assembled. Specifically, the semiconductor light emitting device including the concave-convex structure formed at first interval may be selectively assembled only in the region in which the concave-convex structure formed at the first interval is formed among the entire region of the dielectric layer.

By using this, when assembling different types of semiconductor light emitting devices on one substrate, it is possible to prevent the semiconductor light emitting devices of a specific color from being assembled at an unwanted position.

Meanwhile, the concave-convex structure formed on the dielectric layer may be formed only in a limited area. In relation to this, a process of forming the passivation layer will be described in detail with reference to the accompanying drawings before the description.

Referring to FIG. 15, a passivation layer 370 may be charged between the plurality of semiconductor light emitting devices (FIG. 15(b)). More specifically, as described above, the wiring board 161 can include a plurality of cells 161d partitioned by barrier wall, and a gap may exist between the cells and the semiconductor light emitting device. The passivation layer 370 can fill the gap while covering the semiconductor light emitting device together with the barrier wall.

Through this process, a structure in which the passivation layer 370 surrounds the semiconductor light emitting device may be formed in the display. In this case, the passivation layer 370 may be formed of a polymer material to be integrated with the barrier wall. Although FIG. 15 shows the passivation layer 370 and the barrier wall 261e separately for convenience of explanation, in reality, the passivation layer 370 and the barrier wall 261e may form a single layer. That is, when the passivation layer 370 is formed, the barrier wall 261e becomes a part of the passivation layer 370.

In the display device implemented by the process shown in FIG. 15, the passivation layer 370 may include a plurality of cells, and the plurality of semiconductor light emitting devices 350 may be accommodated in the cells. That is, in the final structure, the cells provided in the self-assembly step are changed into the inner space of the passivation layer 370. In this case, as described above, an electric field generated by the pair electrodes 261c described with reference to FIG. 12 may be formed in the cells. In addition, the plurality of cells are arranged in a matrix structure, and the plurality of pair electrodes 261c have a structure extending to neighboring cells.

Thereafter, a planarization process may be performed so that the upper surface of the passivation layer 370 is flattening, and contact holes 371 and 372 may be formed for wiring (refer to FIG. 15(c)). The contact holes 371 and 372 may be formed in each of the first conductive electrode 352 and the second conductive electrode 356.

Finally, the first wiring electrode 381 and the second wiring electrode 382 are connected to the plurality of semiconductor light emitting devices through the contact hole (FIG. 15(d)).

The first wiring electrode 381 and the second wiring electrode 382 may extend to one surface of the passivation layer 370. In this case, one surface of the passivation layer 370 may be the opposite surface to the surface covering the dielectric layer 261b on the base part 261a. For example, through the first contact hole 371 formed on the upper side of the first conductive electrode 352, the first wiring electrode 381 extends from the first conductive electrode 352 to the top surface of the passivation layer 370. The second wiring electrode 382 extends to the upper surface of the passivation layer 370 through a second contact hole 372 formed above the second conductive electrode 356.

Meanwhile, the concave-convex structure formed in the dielectric layer may be formed only in a region overlapping with the plurality of cells provided in the above-described passivation layer. That is, the concave-convex structure formed on the dielectric layer may be selectively formed only in the region where the semiconductor light emitting devices are disposed.

Alternatively, referring to FIG. 16, the concave-convex structure formed on the dielectric layer may be formed to overlap at least a portion of the passivation layer. For example, the concave-convex structure formed on the dielectric layer 161b may be formed not only in the cell but also around the cell. In this case, the concave-convex structure 161e' may also be formed on one surface of the passivation layer (shown as a barrier wall 261e in FIG. 16) facing the dielectric layer. The concave-convex structure 161b" formed around the cells diffusely reflects light around the semiconductor light emitting device to improve the amount of light in the display.

As described above, in the present invention, by improving the bonding force between the semiconductor light emitting device and the dielectric layer, the semiconductor light emitting device is prevented from being separated from the substrate after self-assembly.

The invention claimed is:
1. A display device comprising:
a base part;
a plurality of assembly electrodes disposed on the base part and having a first electrode and a second electrode that generate an electric field when power is applied;
a dielectric layer disposed to cover the plurality of assembly electrodes;
a plurality of semiconductor light emitting devices disposed on a surface of the dielectric layer; and
a passivation layer disposed on the dielectric layer and having a plurality of cells,
wherein one surface of the plurality of semiconductor light emitting devices facing the dielectric layer and one surface of the dielectric layer facing the plurality of semiconductor light emitting devices respectively comprise a concave-convex structure,
wherein the passivation layer comprises a concave-convex structure disposed on one surface of the passivation layer facing the dielectric layer, and
wherein the concave-convex structure of the passivation layer and the concave-convex structure of the dielectric layer are matched.
2. The display device according to claim 1, wherein the concave-convex structures disposed on the plurality of semi- conductor light emitting devices and the dielectric layer are arranged to engage each other.

3. The display device according to claim 1, wherein the plurality of semiconductor light emitting devices are disposed inside the plurality of the cells, respectively.

4. The display device according to claim 3, wherein the concave-convex structure disposed in the dielectric layer is formed only in a region overlapping the plurality of cells.

5. The display device according to claim 3, wherein the concave-convex structure of the dielectric layer is disposed to overlap at least a portion of the passivation layer.

6. The display device according to claim 5, wherein the concave-convex structure of the dielectric layer is disposed in the plurality of cells and around the plurality of cells.

7. The display device according to claim 3, wherein the concave-convex structure disposed in the dielectric layer is disposed in a region overlapping the plurality of cells and in a region overlapping the passivation layer.

8. The display device according to claim 3, wherein a contact region between the dielectric layer and the passivation layer lack the concave-convex structure.

9. The display device according to claim 1, wherein the concave-convex structures disposed on the plurality of semiconductor light emitting devices and the dielectric layer are formed at a predetermined interval.

10. The display device according to claim 9, wherein the plurality of semiconductor light emitting devices comprise a first semiconductor light emitting device comprising the concave-convex structure disposed at a first interval and a second semiconductor light emitting device comprising the concave-convex structure disposed at a second interval.

11. The display device according to claim 10, wherein the dielectric layer comprises the concave-convex structure disposed at the first interval and the concave-convex structure disposed at the second interval, respectively.

12. The display device according to claim 1, wherein the concave-convex structure disposed in the plurality of semiconductor light emitting devices is made of any one of Au, Ag, Al, Cu, Mo, Cr, Ti, Ni, W, Ge, or an alloy in which at least some of Au, Ag, Al, Cu, Mo, Cr, Ti, Ni, W, Ge are mixed.

13. The display device according to claim 1, wherein the concave-convex structure disposed on the dielectric layer is made of a metal oxide or made of the same material as the dielectric layer.

14. The display device according to claim 1, wherein the concave-convex structure of the dielectric layer comprises different patterns on one surface thereof.

15. The display device according to claim 14, wherein the concave-convex structure of the dielectric layer comprises a first concave-convex structure disposed at a first interval, a second concave-convex structure disposed at a second interval, and a third concave-convex structure disposed at a third interval.

16. The display device according to claim 1, wherein a first part of the concave-convex structure of the passivation layer overlaps the plurality of assembly electrodes and second part of the concave-convex structure of the passivation layer does not overlap the plurality of assembly electrodes.

17. A display device comprising:
a base part;
a plurality of assembly electrodes to generate an electric field when power is applied and disposed on the base part;
a dielectric layer to cover the plurality of assembly electrodes; and
a plurality of semiconductor light emitting devices disposed on the dielectric layer,
wherein at least one concave-convex structure is interposed between the plurality of semiconductor light emitting devices and the dielectric layer,
wherein each of the dielectric layer and the plurality of semiconductor light emitting devices includes a concave-convex structure,
wherein the concave-convex structure of the plurality of semiconductor light emitting devices vertically overlap the plurality of assembly electrodes, and
wherein the dielectric layer is disposed between the concave-convex structure of the plurality of semiconductor light emitting devices and the plurality of assembly electrodes, and
further comprising a passivation layer disposed on the dielectric layer,
wherein the passivation layer comprises a concave-convex structure disposed on one surface of the passivation layer facing the dielectric layer, and
wherein the concave-convex structure of the passivation layer and the concave-convex structure of the dielectric layer are matched.

18. The display device according to claim 17, wherein the concave-convex structure of the plurality of semiconductor light emitting devices and the concave-convex structure of the dielectric layer face each other.

19. The display device according to claim 17, wherein the concave-convex structure of the plurality of semiconductor light emitting devices and the concave-convex structure of the dielectric layer have different intervals.

* * * * *